(12) United States Patent
Alexander

(10) Patent No.: US 6,204,708 B1
(45) Date of Patent: Mar. 20, 2001

(54) APPARATUS AND METHOD FOR AN IMPROVED MASTER-SLAVE FLIP-FLOP WITH NON-OVERLAPPING CLOCKS

(75) Inventor: Sam E. Alexander, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/182,088

(22) Filed: Oct. 29, 1998

(51) Int. Cl.[7] .................................................... H03K 3/289
(52) U.S. Cl. ............................................ 327/203; 327/212
(58) Field of Search ................................... 327/202, 203, 327/210, 211, 212, 291, 295, 299, 239, 256, 257, 259, 269, 270, 271, 272, 276–278, 281, 284, 288

(56) References Cited

U.S. PATENT DOCUMENTS

| | | | |
|---|---|---|---|
| 4,495,628 | * | 1/1985 | Zasio ...................................... 327/202 |
| 4,761,568 | * | 8/1988 | Strongski ............................... 327/259 |
| 4,806,804 | * | 2/1989 | O'Leary ................................. 327/277 |
| 5,081,380 | * | 1/1992 | Chen ...................................... 327/262 |
| 5,446,417 | * | 8/1995 | Korhonen et al. ..................... 327/281 |
| 5,675,279 | * | 10/1997 | Fujimoto et al. ....................... 327/299 |
| 5,705,944 | * | 1/1998 | Mou et al. ............................... 327/74 |
| 5,719,878 | * | 2/1998 | Yu et al. ................................. 327/202 |
| 5,751,176 | * | 5/1998 | Sohn et al. ............................. 327/259 |
| 5,929,680 | * | 7/1999 | Lim ........................................ 327/264 |

* cited by examiner

*Primary Examiner*—Toan Tran
(74) *Attorney, Agent, or Firm*—Baker Botts L.L.P.

(57) ABSTRACT

An improved master-slave flip-flop that is characterized by a novel clock generator. The improved flip-flop preserves the true master-slave relationship by ensuring a two step latching process is executed by non-overlapping clocks. The clock generator features an inverter in combination with a current limiter. The current limiter has the effect of shifting the trip point of the inverter such that non-overlapping clocks may be derived from a single master clock signal or a master clock signal and its complement.

18 Claims, 9 Drawing Sheets

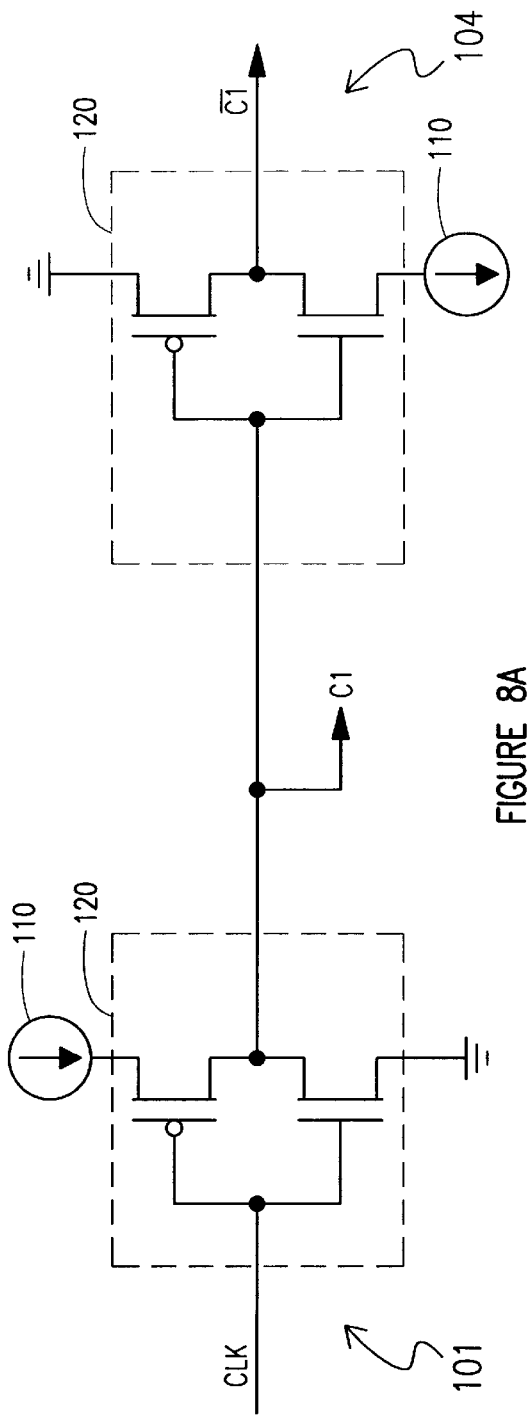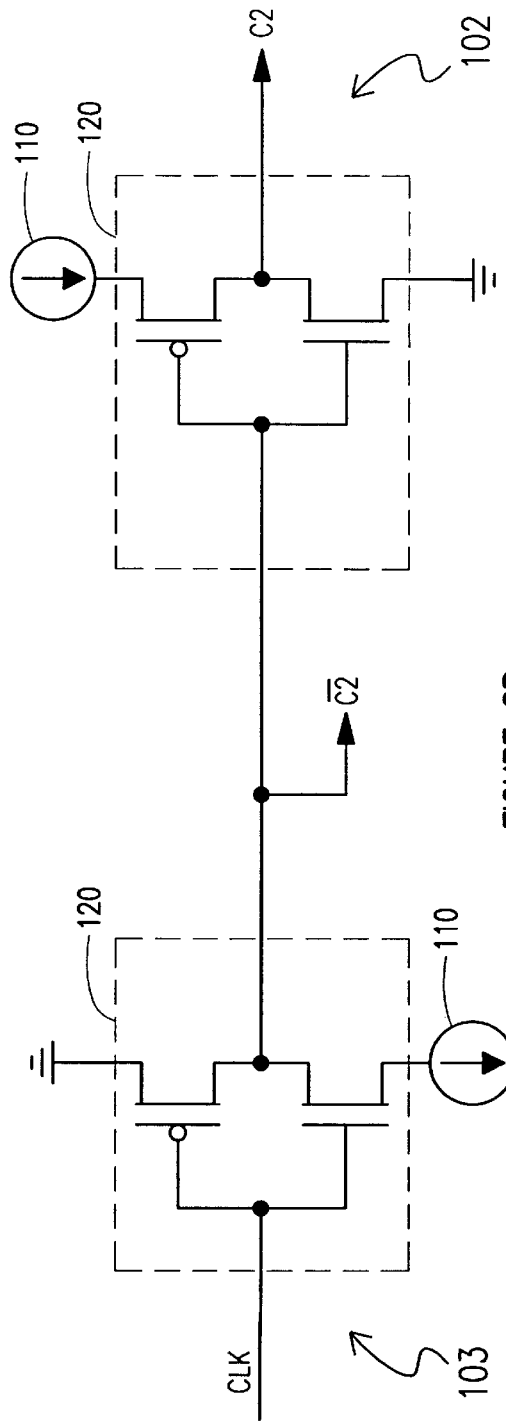
FIGURE 8A
FIGURE 8B

APPARATUS AND METHOD FOR AN IMPROVED MASTER-SLAVE FLIP-FLOP WITH NON-OVERLAPPING CLOCKS

BACKGROUND OF THE INVENTION

1. Field of the Invention

This invention relates generally to digital computer systems and specifically to digital computer systems which rely on master-slave latches or flip-flops. The invention provides an apparatus and method for generating quickly slewing clock signals with non-overlapping duty cycles from a master clock that has relatively slow rise and fall times.

2. Description of the Prior Art

Referring to FIG. 1, the current state of the art describes a master-slave latch combination in which data is clocked into the master latch 20 and slave latch 40 through a two sets of gating transistor pairs 10 and 30, respectively, by a master clock CLK and its complement CLK[1]. D indicates the input data and Q represents the static state output of D after proper latching by the master latch 20 and the slave latch 40. The master clock signal CLK and its complement CLK are depicted in FIG. 2.

[1] The conventional method to indicate a complementary signal is to overline the signal. However, due to a word processing limitation, following this convention is not possible. Thus, in the text of this application the symbol for a complementary signal is set for as the signal underlined (e.g. CLK).

When properly operating, the master clock CLK goes from low to high, the gating transistor pair 10 is conducting and data is permitted to pass into the master latch 20. Also at this time, because the clock signals are inverted at gating transistor pair 30, this transistor pair is switched off and data is not permitted to pass into the slave latch 40.

When the master clock CLK reverses state, i.e. from high to low, the first gating transistor pair 10 ceases to conduct. However, the second gating transistor pair 30 begins conducting and the data which was latched into the master latch 20 is now permitted to pass into the slave latch 40. After a brief propagation delay, the data is latched and stable at output Q.

Thus, when the master-slave latch is operating properly, latching occurs in two separate, discrete steps. These two steps provides for stable data at output Q. However, a problem arises during slow rise and fall times of the master clock CLK.

The problem during the clock transition characterized by relatively slow rise and fall times is that both gating transistor pairs 10 and 30 may be partially conducting at the same time. This will result in the data racing through the master-slave latch pair 20 and 40 without achieving a steady state. This occurs when the two step process described above is circumvented because of overlapping master clock signals as a result of relatively slow rise and fall times. Therefore, a need existed to provide a master-slave latch pair with non-overlapping clock signals to permit proper latching of data in a two step process for master-slave latches.

SUMMARY OF THE INVENTION

It is an object of the present invention to provide a master-slave flip-flop which prevents data from racing through the device without being properly latched.

It is another object of the present invention to provide a master-slave flip-flop which prevents partial conduction of the gating transistor pairs.

It is another object of the present invention to provide an improved clock generator which produces non-overlapping clock signals from a master clock signal.

It is another object of the present invention to combine the non-overlapping clock signals provided by the improved clock generators with gating transistor pairs and master-slave latches to preserve the two, discrete latching steps of a master-slave flip-flop.

In accordance with one embodiment of the present invention, an improved master-slave flip-flop comprises a master gating transistor pair, a master latch coupled to the master gating transistor pair, a slave gating transistor pair coupled to the master latch, a slave latch coupled to the slave gating transistor pair, a clock generator coupled to the master gating transistor pair, a second clock generator coupled to the master gating transistor pair, a third clock generator coupled to the slave gating transistor pair, and a fourth clock generator coupled to the slave gating transistor pair.

In accordance with another embodiment of the present invention, a clock generator is comprised of a current limiter and an inverter coupled to the current limiter. Furthermore, the current limiter may be implemented as a current mirror.

In accordance with another embodiment of the present invention the trip point of the inverter is adjusted by means of the current limiter or by geometrical manipulation of the CMOS devices which comprise the inverter.

In accordance with another embodiment of the present invention, non-overlapping clocks may be derived from a single master clock signal by the clock generators.

In accordance with another embodiment of the present invention, non-overlapping clocks may be derived from a single master clock signal and the complement of the master clock signal.

The foregoing and other objects, features, and advantages of the invention will be apparent from the following, more particular, description of the preferred embodiments of the invention, as illustrated in the accompanying drawings.

BRIEF DESCRIPTION OF THE DRAWINGS

FIGS. 8A and 8B illustrate an alternative embodiment of the clock generators in the present invention using a single master clock signal without its complement.

DETAILED DESCRIPTION OF THE PREFERRED EMBODIMENT

Figure 1:
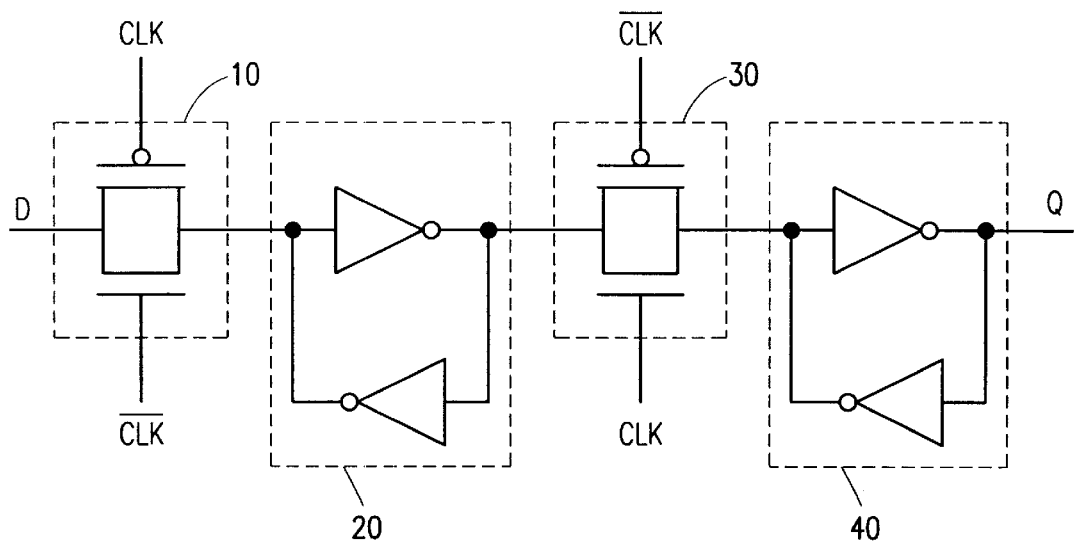
FIG. 1 is a simplified diagram of a master-slave latch pair.
Figure 2:
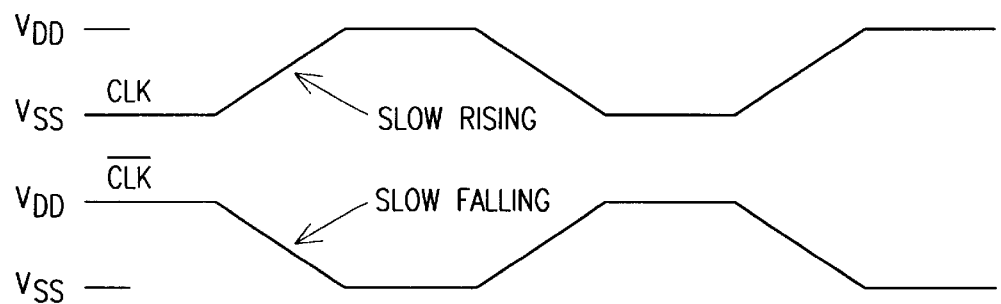
FIG. 2 illustrates a master clock and complement with relatively slow rise and fall times.
Figure 3:
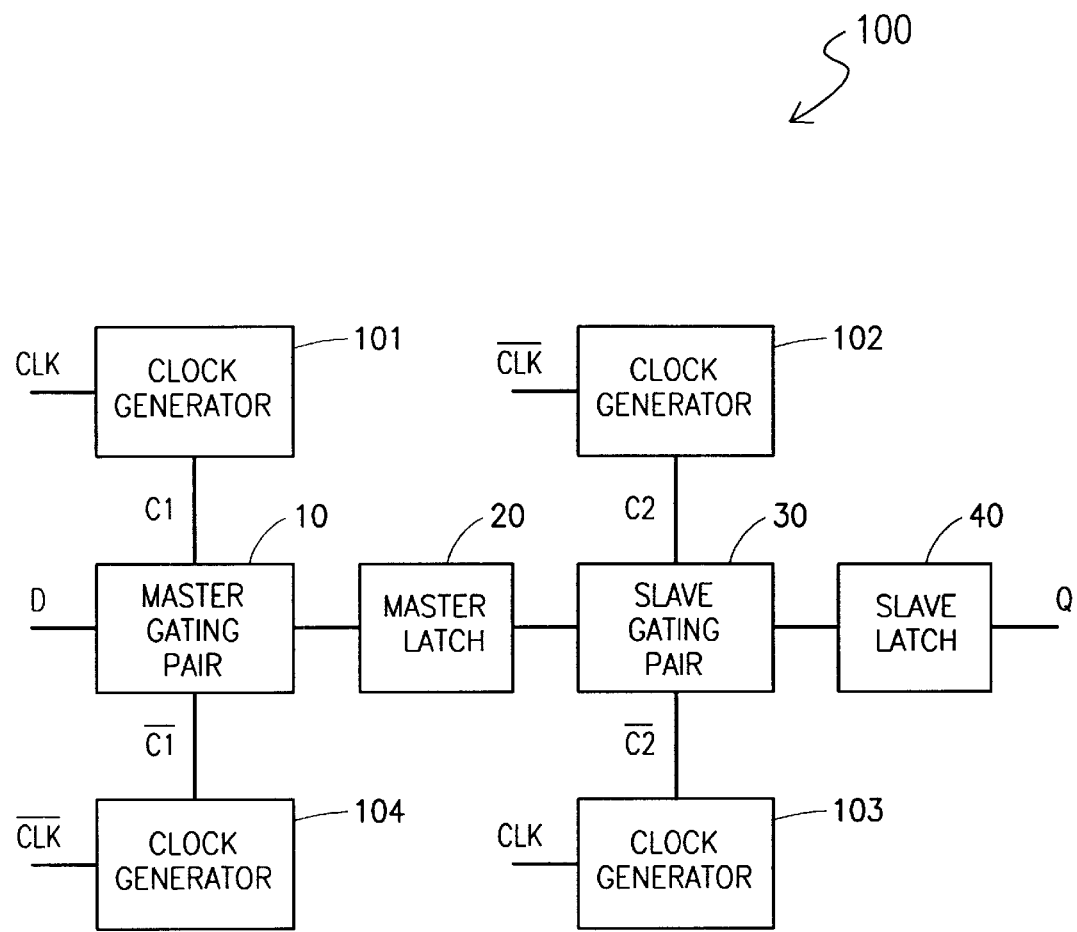
FIG. 3 is a block diagram of the present invention.

Referring to FIG. 3, an improved master-slave flip-flop with non-overlapping clocks 100 is shown. The invention is comprised of a master gating transistor pair 10, a master latch 20, a slave gating transistor pair 30, a slave latch 40 and four independent clock generators 101–104. Input data D occurs at the input side of master gating pair 10 and output Q occurs at the output of slave latch 40.

Figure 4B:
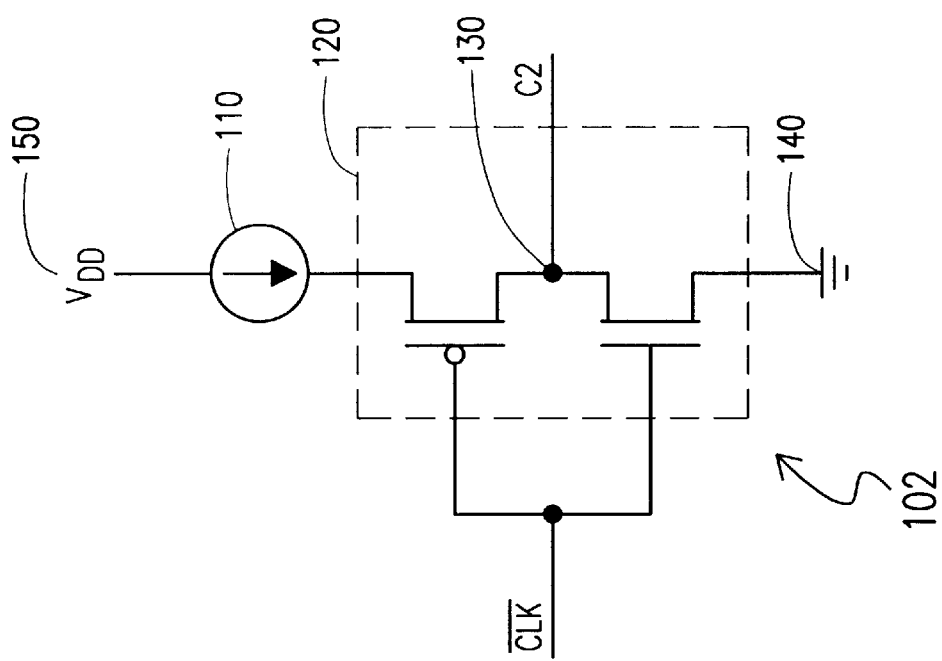
FIGS. 4A, 4B, 4C and 4D are various embodiments of the clock generator in the present invention which rely on a master clock signal and its complement.
Figure 4A:
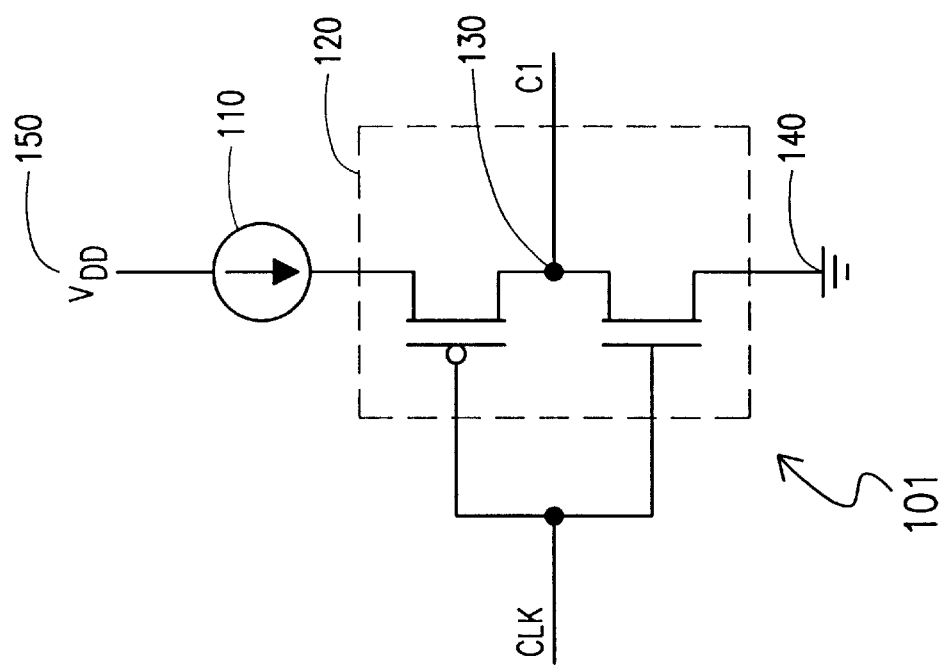
Figure 4D:
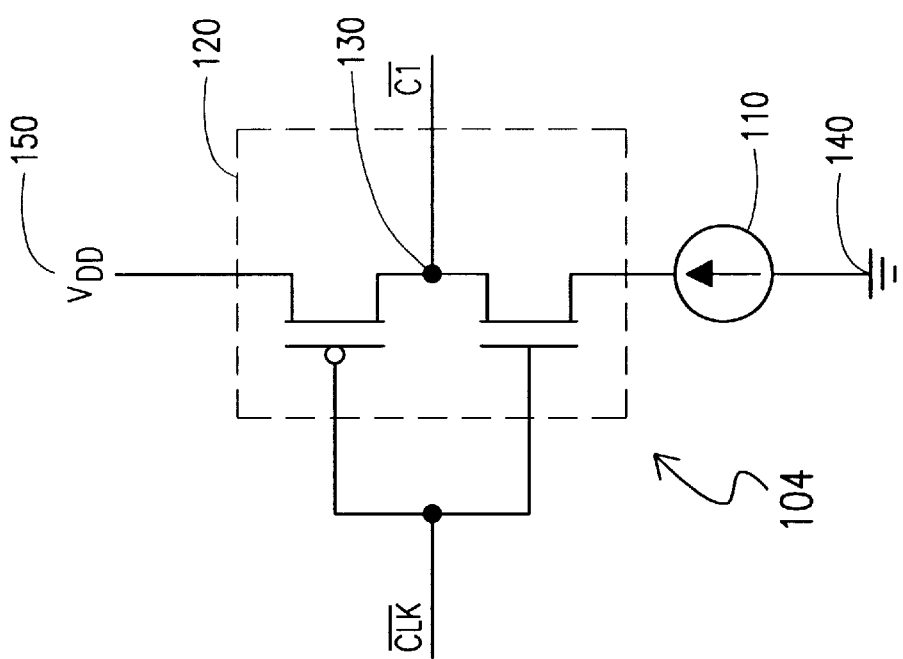
Figure 4C:
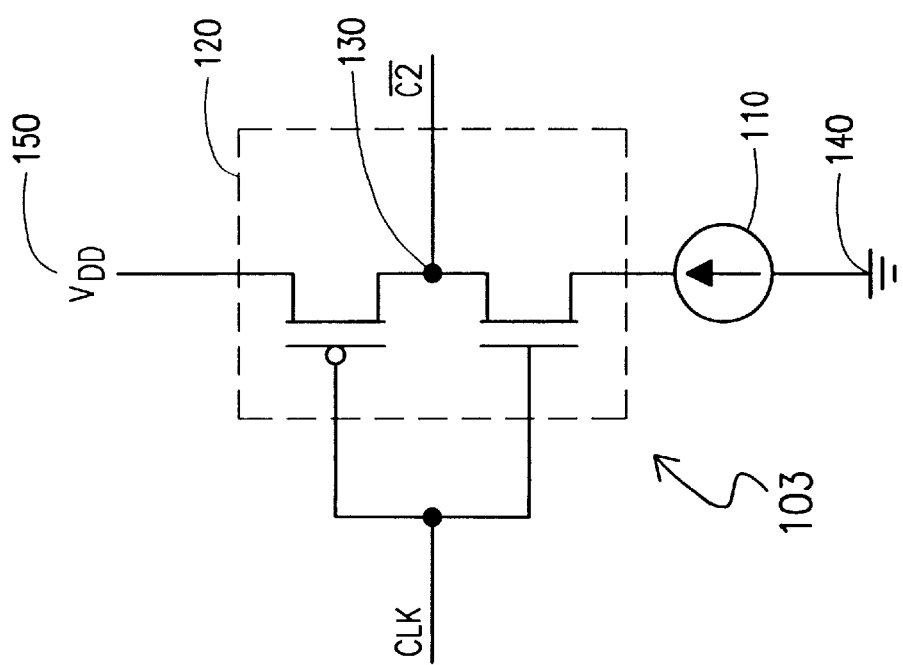

Referring to FIGS. 4A, 4B, 4C and 4D, simplified diagrams of the clock generators 101–104 are shown comprising of a current limiter 110 coupled to a two transistor inverter 120. The current limiter 110 may be positioned either on the power side of the transistor pair as shown in FIGS. 4A and 4B, i.e. in series with the P-channel device as depicted by 101 and 102; or on the ground potential side of the transistor pair as shown in FIGS. 4C and 4D, i.e in series with the N-channel device as depicted by 103 and 104. The input may be either the master clock CLK, as in FIGS. 4A and 4C or the complementary master clock CLK, as in FIGS. 4B and 4D. The phase shift in the CLK versus CLK input will simply result in a comparable phase shift in the output of the inverter 120.

Figure 6B:
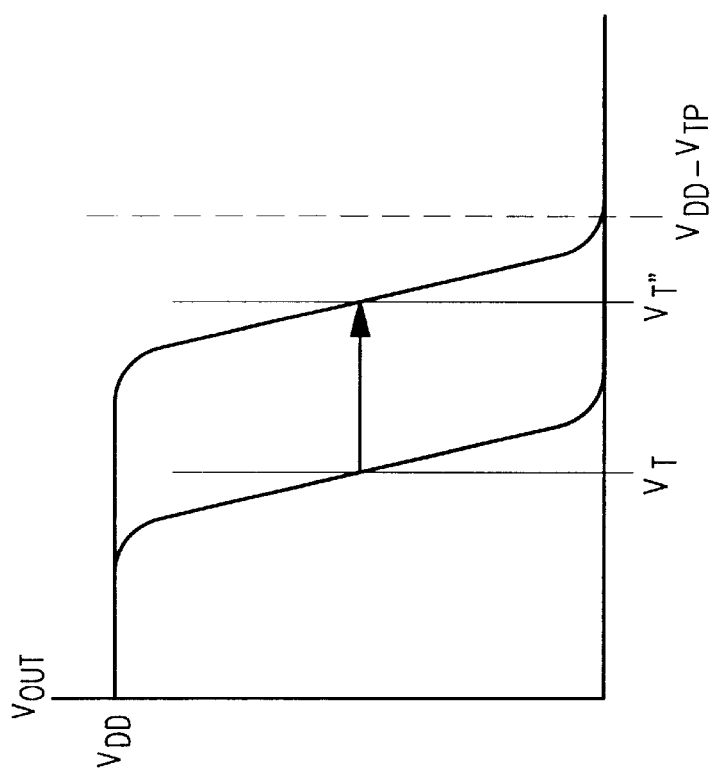
FIGS. 6A and 6B illustrate how the present invention shifts the trip point of an inverter.
Figure 6A:
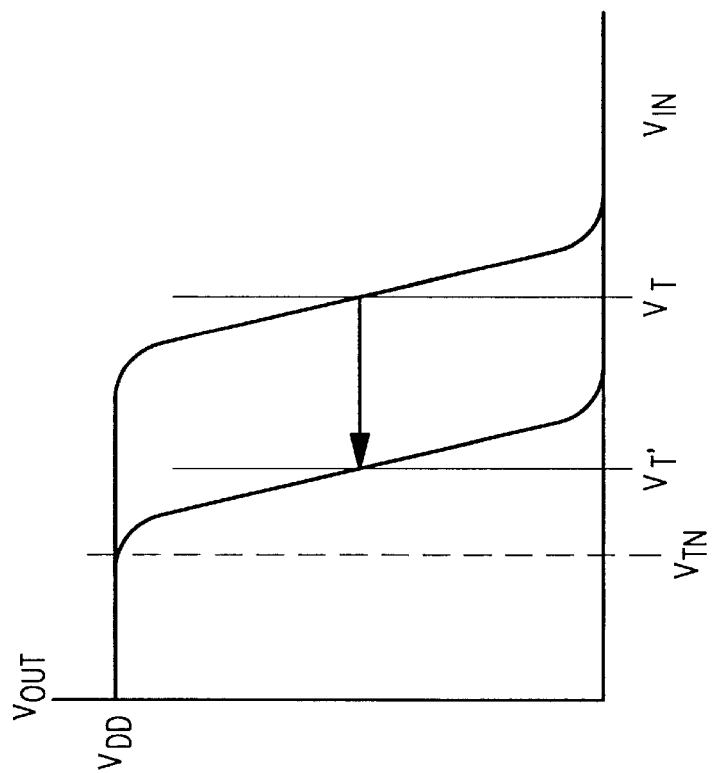

The purpose of the current limiter 110 is to shift the trip point of the transistor pair 120 from what is normally the approximate midpoint between $V_{DD}$ and $V_{SS}$. As shown in FIGS. 6A and 6B, the trip point ($V_T$) is conventionally defined as the point where $V_{IN}=V_{OUT}$. However, depending on the positioning of the current limiter 110, the new trip point will approximate either $V_{TN}$ ($V_T$ in FIG. 6A) or $V_{DD}-V_{TP}$ ($V_{T'}$ in FIG. 6B). Where $V_{TN}$ is the threshold voltage of the N-channel transistor and $V_{TP}$ is the threshold voltage of the P-channel transistor.

Figure 5B:
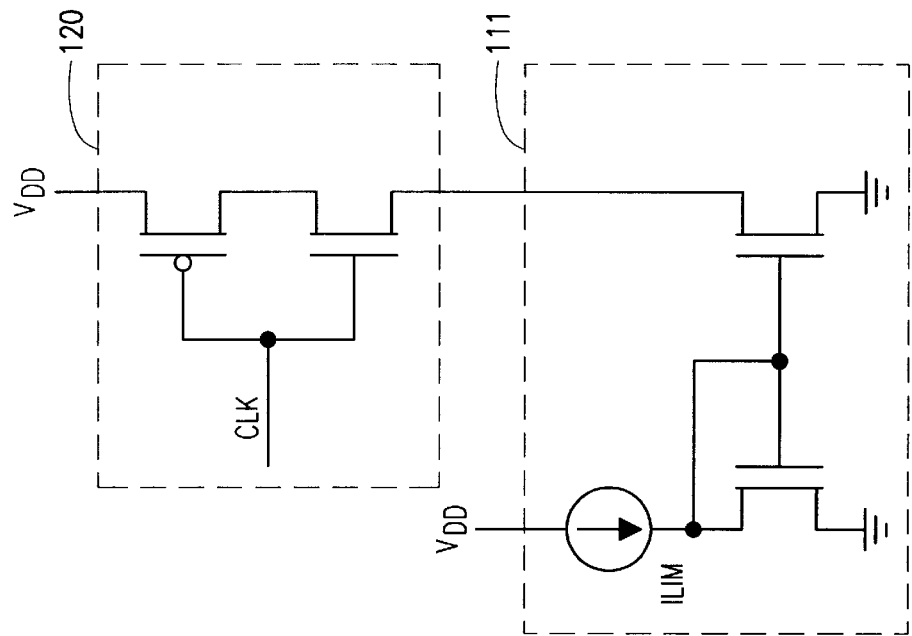
FIGS. 5A and 5B illustrate the clock generator implemented by a current mirror.
Figure 5A:
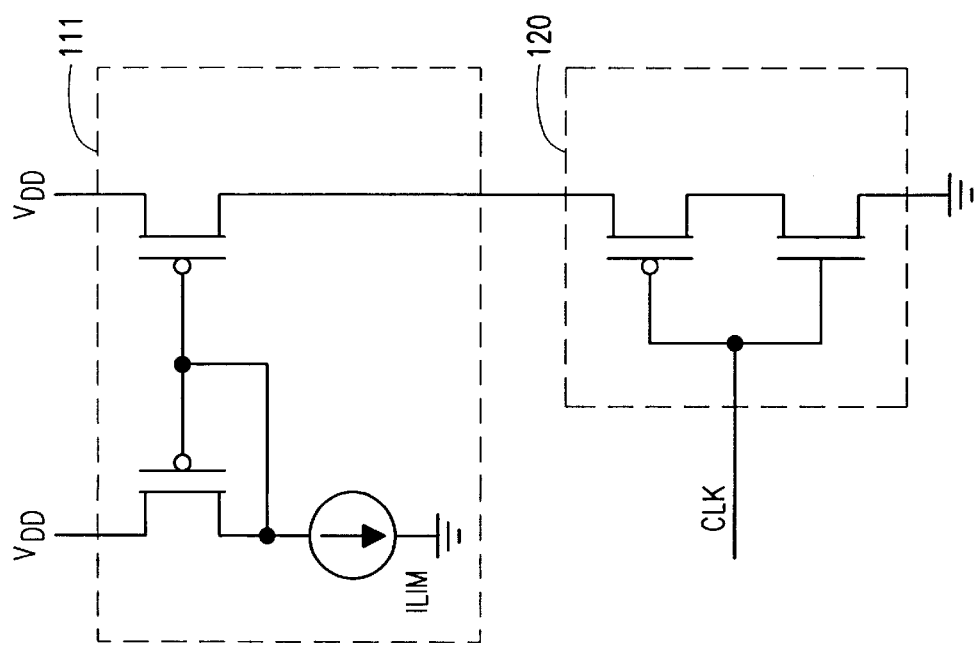

The current limiter 110 may be implemented in a variety of fashions. In the preferred embodiment, the current limiter 110 is implemented via a current mirror 111 as shown in FIGS. 5A and 5B. FIG. 5A illustrates the current mirror 111 in series with and directly connected to the P-channel device. FIG. 5B illustrates the current mirror 111 in series with and directly connected to the N-channel device.

Other embodiments of a current limiter may include components beyond a current mirror to effectively limit current. However, simple resistor networks are typically not preferred because of resulting inefficiencies in the fabrication process.

However, other implementations of adjusting the trip point of the inverter other than the current mirror include geometrical manipulation of the inverter N-channel and P-channel length/width ratio as part of the fabrication process. In this implementation the length/width ratios of the transistors are manipulated in the fabrication process. Additional fabrication techniques to adjust the trip point of the inverter such as doping and ion implantation may also be employed.

The following relates the function of the current limiter 110 to the shift in the trip point $V_T$. Referring to FIG. 4A, disregarding the presence of the current limiter 110 and where the gain of the P-channel transistor is equal to the gain of the N-channel transistor for the inverter 120, then the trip point can be expressed as:

$$V_T=(V_{TN}+(V_{DD}-V_{TN}))/2=(V_{DD})/2 \quad (1)$$

Thus, in the absence of a current limiter 110, the trip point is approximately half of the supply voltage $V_{DD}$. Gain is defined as the width to length ratio of the transistor multiplied by a constant. If the gain of the N- and P-channel transistors are not equal then the denominator of equation (1) becomes more complicated in the form of $1+(k_P/k_N)^{0.5}$, where $k_P$ and $k_N$ are the gain ratios of the P- and N-channel transistors, respectively. Thus, it becomes intuitive that shifting the trip point can be accomplished by altering the gain ratios as between the N- and P-channel transistors. The gain ratios $k_P$, and $k_N$, are determined by the length/width ratios of the respective transistors as well as by fabrication parameters. However, if the gain ratios are equal, then the denominator of equation (1) is simply $1+(1)^{0.5}$, or 2.

At this point the current limiter 110 is introduced into the circuit and the relationship between current and the trip point $V_T$ is explained. Assuming that both the N- and P-channel transistors 120 are in saturation, the well known saturated current equation for a MOS transistor is given as:

$$I_D=(k/2)*(V_{GS}-V_{TH})^2 \quad (2)$$

Where, $I_D$ is the current at the drain, k is the gain factor, $V_{GS}$ is the gate-source voltage and $V_{TH}$ is the threshold voltage.

For a current limiter 110 in series with and directly connected to the P-channel transistor, as depicted in FIGS. 4A and 4B, the N-channel transistor is the relevant device for determining the new trip point because the N-channel transistor is without a current limitation between the output node 130 and the lower rail 140. The P-channel device is not relevant in determining the new trip point for FIGS. 4A and 4B because the current limiter 110 is in series with the P-channel transistor and both the current limiter 110 and P-channel device are located between the upper rail $V_{DD}$ 150 and the output node 130. Thus, the P-channel device's contribution to the new trip point is regulated by the current limiter 110. The current for the N-channel transistor is expressed as follows.

$$I_N=I_{LIM}=(k_N/2)(V_{IN}-V_{TN})^2 \quad (3)$$

Where $I_N$ is equal to the current through the N-channel transistor. $I_{LIM}$ is the current provided by the current limiter 110. At the trip point $I_N=I_{LIM}$. $k_N$ is the gain factor of the N-channel transistor, $V_{IN}$ is the input voltage and $V_{TN}$ is the threshold voltage of the N-channel device. Rearranging terms, and identifying $V_{IN}$ as the desired trip point, we have:

$$V_T=V_{IN}=((2*I_{LIM})/k_N)^{0.5}+V_{TN} \quad (4)$$

Thus, if the current $I_{LIM}$ is limited to a small amount, then:

$$V_T \approx V_{TN} \quad (5)$$

This equation (5) is reflected in FIG. 6A, where the trip point is shifted to $V_T$, which is approximately VTN, by means of the current limiter 110 in series with the P-channel transistor.

In the case of the current limiter 110 in series with and directly connected to the N-channel transistor, as depicted in FIGS. 4C and 4D, the equations are as follows:

$$I_P=I_{LIM}=(k_P/2)(V_{IN}-V_{DD}-|V_{TP}|)^2 \quad (6)$$

Where $I_P$ is equal to the current through the P-channel transistor. $I^{LIM}$ is the current provided by the current limiter 110. At the trip point $I_P=I_{LIM}$. $k_P$ is the gain factor of the P-channel transistor, $V_{IN}$ is the input voltage and $V_{TP}$ is the threshold voltage of the P-channel device. Rearranging terms, and once again identifying $V_{IN}$ as the desired trip point, we have:

$$V_T=V_{IN}=((2*I_{LIM})/k_P)^{0.5}+V_{DD}-|V_{TP}| \quad (7)$$

Thus, if the current $I_{LIM}$ is limited to a small amount then:

$$V_T \approx V_{DD}-|V_{TP}| \quad (8)$$

This equation (8) is reflected in FIG. 6B, where the trip point is shifted to $V_{T'}$ which is approximately $V_{DD}-|V_{TP}|$ by means of the current limiter 110 in series with the N-channel transistor.

Figure 7:
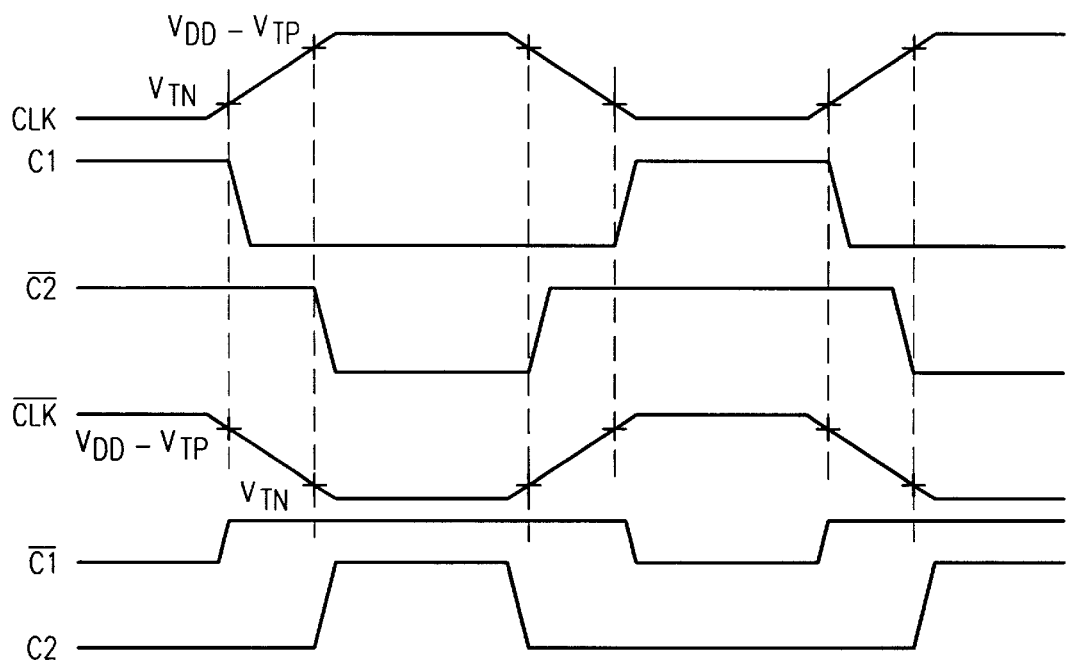
FIGS. 7 is a timing diagram of the non-overlapping clock signals derived from complementary master clock signals.

FIG. 7 illustrates the operation of the present invention from a timing diagram perspective. CLK is the master clock and is the input parameter to clock generator 101 as shown in FIG. 4A. C1 is the output of clock generator 101. Note that the trip point for C1 has shifted to $V_{TN}$ because of the current limiter 110 in series with the P-channel device. CLK is also the input parameter to clock generator 103 as depicted in FIG. 4C. C2 is the output of clock generator 103. Note that the trip point for C2 has shifted to $V_{DD}-|V_{TP}|$ because of the current limiter 110 in series with the N-channel device.

Turning next to the clocks generated by the complementary master clock $\overline{CLK}$. $\overline{CLK}$ is the input parameter to clock generator 102 as shown in FIG. 4B. $\overline{C2}$ is the output of clock generator 102. Note that the trip point for $\overline{C2}$ has shifted to $V_{TN}$ because of the current limiter 110 in series with the P-channel device. Further note that C1 and $\overline{C2}$ are non-overlapping clocks for an active high signal. $\overline{CLK}$ is also the input parameter to clock generator 104 as depicted in FIG. 4D. $\overline{C1}$ is the output of clock generator 102. Note that the trip point for $\overline{C1}$ has shifted to $V_{DD}-|V_{TP}|$ because of the current limiter 110 in series with the N-channel device. Further note that $\overline{C1}$ and C2 are non-overlapping clocks for an active low signal.

Referring to FIG. 3, C1 and $\overline{C1}$ are applied to the gating transistor pair 10. C2 and $\overline{C2}$ are applied to the gating transistor pair 30. Thus, by having non-overlapping clocks at the gating transistor pairs 10 and 30, the two discrete latching process of the master-slave device is preserved because the non-overlapping clocks ensure that the incoming data D must first be latched into the master latch before it can be latched into the slave latch.

Referring to FIGS. 8A and 8B, where like numerals represent like elements, an alternative embodiment of the present invention is shown which relies on a single master clock CLK, as opposed to the complementary signals CLK & $\overline{CLK}$, to produce the non-overlapping synthesized clocks: C1, $\overline{C1}$, C2 & $\overline{C2}$. In FIG. 8A, the clock generators 101 and 104, with current limiters 110 and the two transistor inverters 120, are as previously described. The clock generator 104 is connected to the output of clock generator 101 which is the derived clock C1. The output of clock generator 104 is $\overline{C1}$.

Similarly, in FIG. 8B, clock generator 102 is connected to the $\overline{C2}$ output of clock generator 103. Thus the output of clock generator 102 is the complement of $\overline{C2}$, which is the derived non-overlapping clock C2. Therefore, a more robust, yet simpler and more flexible approach is to derive C1, $\overline{C1}$, C2 and $\overline{C2}$ from a common or single master clock CLK.

Figure 9:
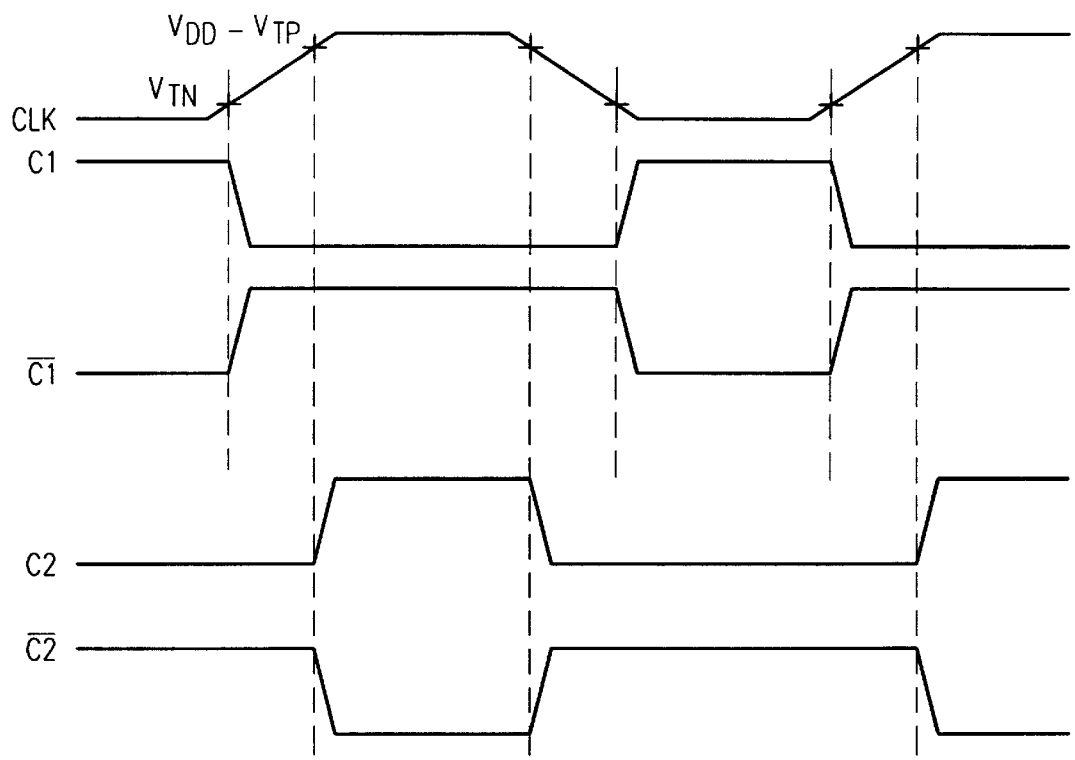
FIG. 9 is a timing diagram of the non-overlapping clock signals derived from a single master clock signal.

Referring to FIG. 9, the timing diagrams of the single CLK input and the non-overlapping clock outputs of the clock generators illustrated in FIGS. 8A and 8B are shown. Thus, the result is the same as illustrated in FIG. 7, where C1, $\overline{C1}$, C2 and $\overline{C2}$ are derived from a combination of CLK and $\overline{CLK}$.

The invention has been particularly shown and described with reference to a preferred embodiment thereof, it will be understood by those skilled in the art that changes in form and detail may be made therein without departing from the spirit and scope of the invention.

What is claimed is:

1. An improved master-slave flip-flop comprising:
   a master gating transistor pair having an input and an output, and first and second clock inputs, wherein the master gating transistor pair is conductive when the first and second clock inputs are at first and second logic levels, respectively, and is not conductive when the first and second clock inputs are at the second and first logic levels, respectively;
   a master latch having an input and an output, the master latch input coupled to the output of the master gating transistor pair, wherein the master latch will be set to a certain logic level that is the same as a logic level at the input of the master gating transistor pair when the master gating transistor pair is conductive, and will retain this certain logic level when the master gating transistor pair is not conductive;
   a slave gating transistor pair having an input and an output, and third and fourth clock inputs, wherein the slave gating transistor pair is conductive when the third and fourth clock inputs are at the first and second logic levels, respectively, and is not conductive when the third and fourth clock inputs are at the second and first logic levels, respectively, the input of the slave gating transistor pair is coupled to the master latch;
   a slave latch having an input and an output, the slave latch input coupled to the output of the slave gating transistor pair, wherein the slave latch will be set to a certain logic level that is the same as a logic level at the input of the slave gating transistor pair when the slave gating transistor pair is conductive, and will retain this certain logic level when the slave gating transistor pair is not conductive;
   a first clock generator having an input and an output, the output of the first clock generator is coupled to the first clock input of the master gating transistor pair;
   a second clock generator having an input and an output, the output of the second clock generator is coupled to the second clock input of the master gating transistor pair;
   a third clock generator having an input and an output, the output of the third clock generator is coupled to the third clock input of the slave gating transistor pair; and
   a fourth clock generator having an input and an output, the output of the fourth clock generator is coupled to the fourth clock input of the slave gating transistor pair;
   wherein,
   the first clock generator output logic level changes at a first input value biased toward the first logic level,
   the second clock generator output logic level changes at a second input value biased toward the second logic level,
   the third clock generator output logic level changes at the first input value biased toward the first logic level, and
   the fourth clock generator output logic level changes at the second input value biased toward the second logic level,
   such that the first and second input values occur at mutually exclusive times;
   thereby preventing the master gating pair and slave gating pair from being conductive at the same time.

2. The flip-flop in accordance with claim 1 wherein the first and third clock generators are each comprised of:
   a current limiter, and
   an inverter coupled to the current limiter such that the first and third clock generator output logic levels change at the first input value.

3. The flip-flop in accordance with claim 2 wherein the current limiter is a current mirror.

4. The flip-flop in accordance with claim 1 wherein the second and fourth clock generators are each comprised of:

a current limiter, and an inverter coupled to the current limiter such that the second and fourth clock generator output logic levels change at the second input value.

5. The flip-flop in accordance with claim 4 wherein the current limiter is a current mirror.

6. The flip-flop in accordance with claim 1 wherein the first and fourth clock generators have a common input.

7. The flip-flop in accordance with claim 6 wherein the second and third clock generators have a common input.

8. The flip-flop in accordance with claim 7 wherein the common input to the second and clock generators is the complement of the common input to the first and fourth clock generators.

9. The flip-flop in accordance with claim 1 wherein a logic output of the first clock generator is the complement of a logic output of the second clock generator.

10. The flip-flop in accordance with claim 1 wherein a logic output of the third clock generator is the complement of a logic output of the fourth clock generator.

11. The flip-flop in accordance with claim 1 wherein the output of the first clock generator is connected to the input of the second clock generator.

12. The flip-flop in accordance with claim 1 wherein the input of the third clock generator is connected to the output of the fourth clock generator.

13. A method of insuring non-overlapping clocks in a master-slave flip-flop comprising a master gating transistor pair having an input and an output, and first and second clock inputs, wherein the master gating transistor pair is conductive when the first and second clock inputs are at first and second logic levels, respectively, and is not conductive when the first and second clock inputs are at the second and first logic levels, respectively; a master latch having an input and an output, the master latch input coupled to the output of the master gating transistor pair, wherein the master latch will be set to a certain logic level that is the same as a logic level at the input of the master gating transistor pair when the master gating transistor pair is conductive, and will retain this certain logic level when the master gating transistor pair is not conductive; a slave gating transistor pair having an input and an output, and third and fourth clock inputs, wherein the slave gating transistor pair is conductive when the third and fourth clock inputs are at the first and second logic levels, respectively, and is not conductive when the third and fourth clock inputs are at the second and first logic levels, respectively, the input of the slave gating transistor pair is coupled to the master latch; and a slave latch having an input and an output, the slave latch input coupled to the output of the slave gating transistor pair, wherein the slave latch will be set to a certain logic level that is the same as a logic level at the input of the slave gating transistor pair when the slave gating transistor pair is conductive, and will retain this certain logic level when the slave gating transistor pair is not conductive; said method comprising the steps of:

providing a first clock generator having an input and an output, the output of the first clock generator is coupled to the first clock input of the master gating transistor pair;

providing a second clock generator having an input and an output, the output of the second clock generator is coupled to the second clock input of the master gating transistor pair;

providing a third clock generator having an input and an output, the output of the third clock generator is coupled to the third clock input of the slave gating transistor pair;

providing a fourth clock generator having an input and an output, the output of the fourth clock generator is coupled to the fourth clock input of the slave gating transistor pair;

changing the first clock generator output logic level when a first input value is biased toward the first logic level, changing the second clock generator output logic level when a second input value is biased toward the second logic level, changing the third clock generator output logic level when the first input value is biased toward the first logic level, and changing the fourth clock generator output logic level when the second input value is biased toward the second logic level, such that the first and second input values occur at mutually exclusive times, thereby preventing the master gating pair and slave gating pair from being conductive at the same time.

14. The method in accordance with claim 13 wherein the step of providing the first clock generator further comprises the steps of:

providing a current limiter; and providing an inverter coupled to the current limiter such that the first clock generator output logic level changes at the first input value.

15. The method in accordance with claim 13 wherein the step of providing the second clock generator further comprises the steps of:

providing a current limiter; and providing an inverter coupled to the current limiter such that the second clock generator output logic level changes at the second input value.

16. The method in accordance with claim 13 wherein the step of providing the third clock generator further comprises the steps of:

providing a current limiter; and providing an inverter coupled to the current limiter such that the third clock generator output logic level changes at the first input value.

17. The method in accordance with claim 13 wherein the step of providing the fourth clock generator further comprises the steps of:

providing a current limiter; and providing an inverter coupled to the current limiter such that the fourth clock generator output logic level changes at the second input value.

18. The method in accordance with claim 13 further comprising the steps of:

providing a master clock input to the first clock generator and a complement of the master clock input to the second clock generator; and providing the master clock input to the fourth clock generator and the complement of the mast clock input to the third clock generator.

* * * * *